(12) United States Patent
Hashimoto

(10) Patent No.: US 7,305,017 B2
(45) Date of Patent: Dec. 4, 2007

(54) SEMICONDUCTOR OPTICAL DEVICE

(75) Inventor: Jun-ichi Hashimoto, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 95 days.

(21) Appl. No.: 11/363,265

(22) Filed: Feb. 28, 2006

(65) Prior Publication Data
US 2006/0198414 A1 Sep. 7, 2006

(30) Foreign Application Priority Data
Mar. 1, 2005 (JP) ............................ 2005-056518

(51) Int. Cl.
*H01S 5/00* (2006.01)
(52) U.S. Cl. ............................... 372/46.01; 372/45.011
(58) Field of Classification Search .............. 372/45.01, 372/46.01, 75, 43.01, 50.121
See application file for complete search history.

(56) References Cited

U.S. PATENT DOCUMENTS

| | | | | |
|---|---|---|---|---|
| 5,727,015 | A | * | 3/1998 | Takahashi et al. ............ 372/96 |
| 6,381,258 | B1 | * | 4/2002 | Takei et al. .................... 372/96 |
| 2003/0063644 | A1 | * | 4/2003 | Fukunaga .................... 372/46 |

FOREIGN PATENT DOCUMENTS

JP 05-021903 1/1993

OTHER PUBLICATIONS

U.S. Appl. No. 11/363,264, filed Feb. 28, 2006, Jun-ichi Hashimoto.

"Extremely low operating current SOA gate for WDM applications", T. Ito e al., OECC' 97 Technical Digest, Jul. 1997, Seoul Korea, PDP1-1, pp. 2-3.

* cited by examiner

*Primary Examiner*—Minsun Oh Harvey
*Assistant Examiner*—Tuan N. Nguyen
(74) *Attorney, Agent, or Firm*—Smith, Gambrell & Russell, LLP

(57) ABSTRACT

In a semiconductor optical device, the semiconductor substrate has a primary surface intersecting with a predetermined axis. The lower cladding region of the first conductive type is provided on the primary surface thereof. The lower cladding region includes ridge regions and a base region. The base region has first portions and second portions. The first portions and the second portions are alternately arranged along a predetermined plane perpendicular to the predetermined axis. Each first portion extends in an optical propagating direction. Each second portion extends in the optical propagating direction. Each ridge region is located on each second portion. Each ridge region has a side and a top, and each first portion has a top. The upper cladding layer of the second conductive type is provided on the primary surface of the semiconductor substrate. The bulk active layer is provided between the upper cladding layer and the lower cladding region. The bulk active layer includes first portions, second portions and third portions. Each first portion of the bulk active layer is located on each first portion of the base region of the lower cladding region. Each second portion of the bulk active layer is located on the top of each ridge region and each third portion of the bulk active layer is located on the side of the ridge region.

12 Claims, 3 Drawing Sheets

SEMICONDUCTOR OPTICAL DEVICE

BACKGROUND OF THE INVENTION

1. Field of the Invention

The present invention relates to a semiconductor optical device.

2. Related Background of the Invention

One type of conventional semiconductor optical devices includes an active layer having a bulk structure, and the active layer is provided between the upper cladding layer and the lower cladding layer. This type encompasses semiconductor optical amplifiers, and in order to reduce the dependence of amplification characteristics thereof on polarization direction, one of the semiconductor optical amplifiers includes a mesa-shaped active layer and the cross section of the active layer, taken along a plane intersecting with the direction in which light in the active layer propagates, is square. Publication (T. Ito et al. OECC' 97, PDP101, pp 2-3, 1997) discloses such a semiconductor optical amplifier.

SUMMARY OF THE INVENTION

In most cases, the active layer of the above semiconductor optical amplifier is formed into a mesa shape by wet etching because its processing damages to the active layer are small.

However, because of isotropic etching characteristics of wet etching, the active layer of the semiconductor optical amplifier is side-etched, and thus it is difficult to form the active layer of a square cross section. Consequently, the difference between TE mode amplification characteristics and TM mode amplification characteristics is large. Therefore, the dependence of amplification characteristics on polarization direction cannot be reduced easily in the conventional semiconductor optical amplifier with a bulk active layer.

This results in undesired poor yield of the conventional semiconductor optical amplifier that has a small dependence of amplification characteristics on polarization direction.

It is an object of the present invention to provide a semiconductor optical device of a structure that can reduce its dependence of amplification characteristics on polarization direction and can provide better yield thereof.

According to one aspect of the present invention, a semiconductor optical device comprises a semiconductor substrate, a lower cladding region, an upper cladding layer and a bulk active layer. The semiconductor substrate has a primary surface. The primary surface intersects with a predetermined axis. The lower cladding region of the first conductive type is provided on the primary surface of the semiconductor substrate. The lower cladding region includes a plurality of ridge regions and a base region. The base region has a plurality of first portions and a plurality of second portions. The first portions and the second portions are alternately arranged along a predetermined plane perpendicular to the predetermined axis. Each first portion extends in a optical propagating direction, and each second portion extends in the optical propagating direction. Each ridge regions is located on each second portion. Each ridge region has a side and a top, and each first portion has a top. The upper cladding layer of the second conductive type is provided on the primary surface of the semiconductor substrate. The bulk active layer is provided between the upper cladding layer and the lower cladding region. The bulk active layer includes a plurality of first portions, a plurality of second portions and a plurality of third portions. Each first portion of the bulk active layer is located on each first portion of the base region of the lower cladding region, each second portion of the bulk active layer is located on the top of each ridge and each third portion of the bulk active layer is located on the side of the ridge region.

According to the semiconductor optical device, the active layer has compressive strain.

According to the semiconductor optical device, the active layer has tensile strain.

The semiconductor optical device according to the present invention further includes a first optical confinement layer and a second optical confinement layer. The first optical confinement is provided between the active layer and the lower cladding region. The first optical confinement layer has a bandgap energy between that of the active layer and that of the lower cladding region and the first optical confinement layer has a refractive index between that of the active layer and that of the lower cladding region. The second optical confinement layer is provided between the active layer and the upper cladding layer. The second optical guide layer has a bandgap energy between that of the active layer and that of the upper cladding layer and the second optical confinement layer has a refractive index between that of the active layer and that of the upper cladding layer.

According to the semiconductor optical device, the plurality of ridges and the base region are integrally formed to provide a lower cladding region.

The semiconductor optical device according to the present invention further comprises an etch stop layer. The etch stop layer is made of material of a etching rate lower than that of the lower cladding region. The etch stop layer is provided between the ridge and the base region of the lower cladding region. A distance between the top of the ridge and the primary surface of the substrate is larger than a distance between the top of the first portion of the base region of the lower cladding region and the primary surface of the substrate.

In the semiconductor optical device according to the present invention, the semiconductor optical device includes a semiconductor laser. In the semiconductor optical device according to the present invention, the semiconductor optical device includes a light emitting diode.

In the semiconductor optical device according to the present invention, the semiconductor optical device includes a semiconductor optical amplifier. In the semiconductor optical device according to the present invention, the semiconductor optical device includes an electro-absorption type modulator.

In the semiconductor optical device according to the present invention, the semiconductor optical device includes a semiconductor optical waveguide. In the semiconductor optical device according to the present invention, the semiconductor optical device includes a Mach-Zehnder type optical modulator.

BRIEF DESCRIPTION OF THE DRAWINGS

The above-described object and other objects, features, and advantages of the present invention will become apparent more easily in the detailed description of the preferred embodiments of the present invention which will be described below with reference to the accompanying drawings.

DESCRIPTION OF THE PREFERRED EMBODIMENTS

The teachings of the present invention will readily be understood in view of the following detailed description with reference to the accompanying drawings illustrated by way of example. When possible, parts identical to each other will be referred to with reference symbols identical to each other.

First Embodiment

Figure 1:
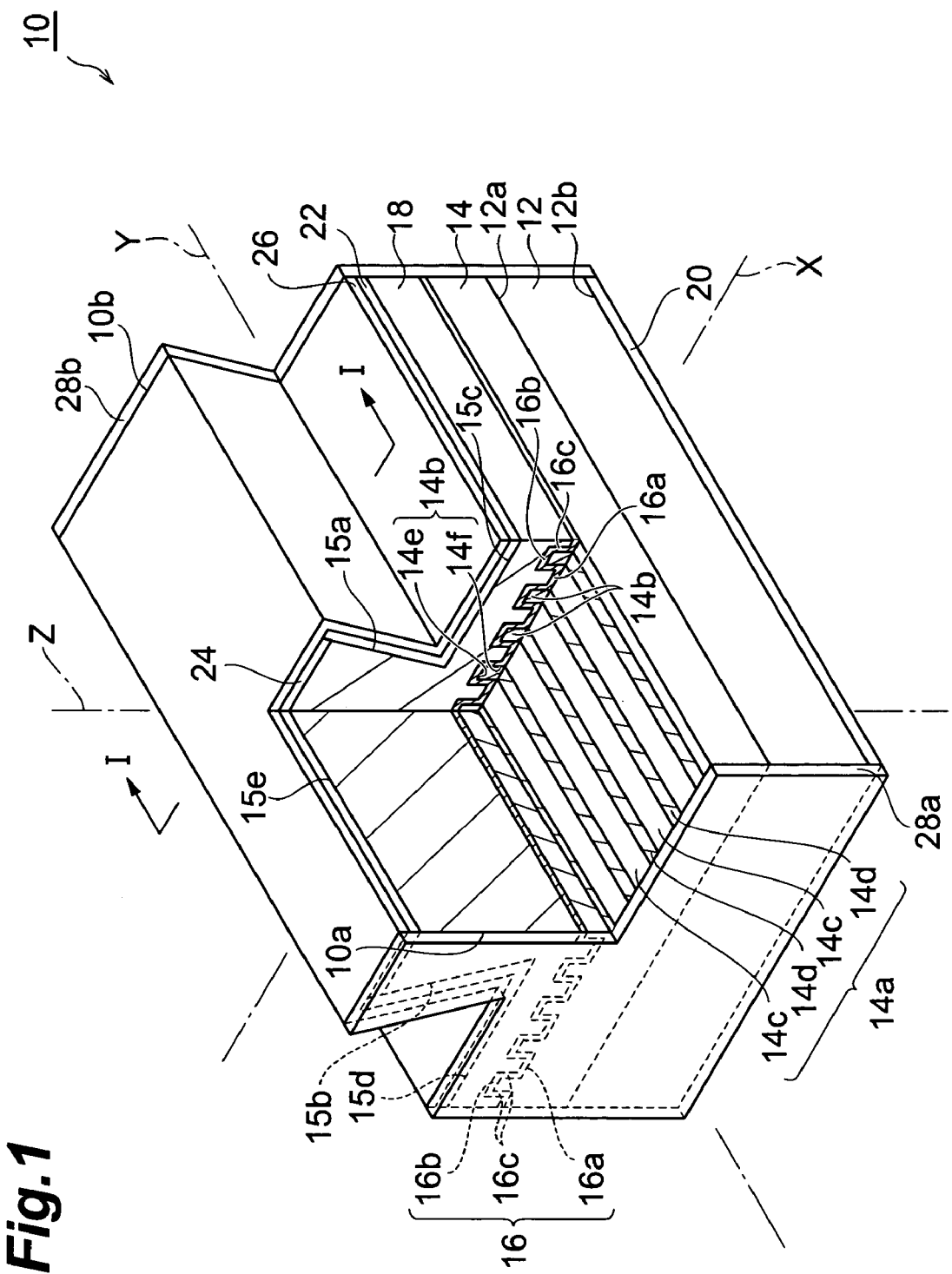
FIG. 1 is a perspective view partly in section showing a semiconductor optical amplifier according to the first embodiment of the present invention.
Figure 2:
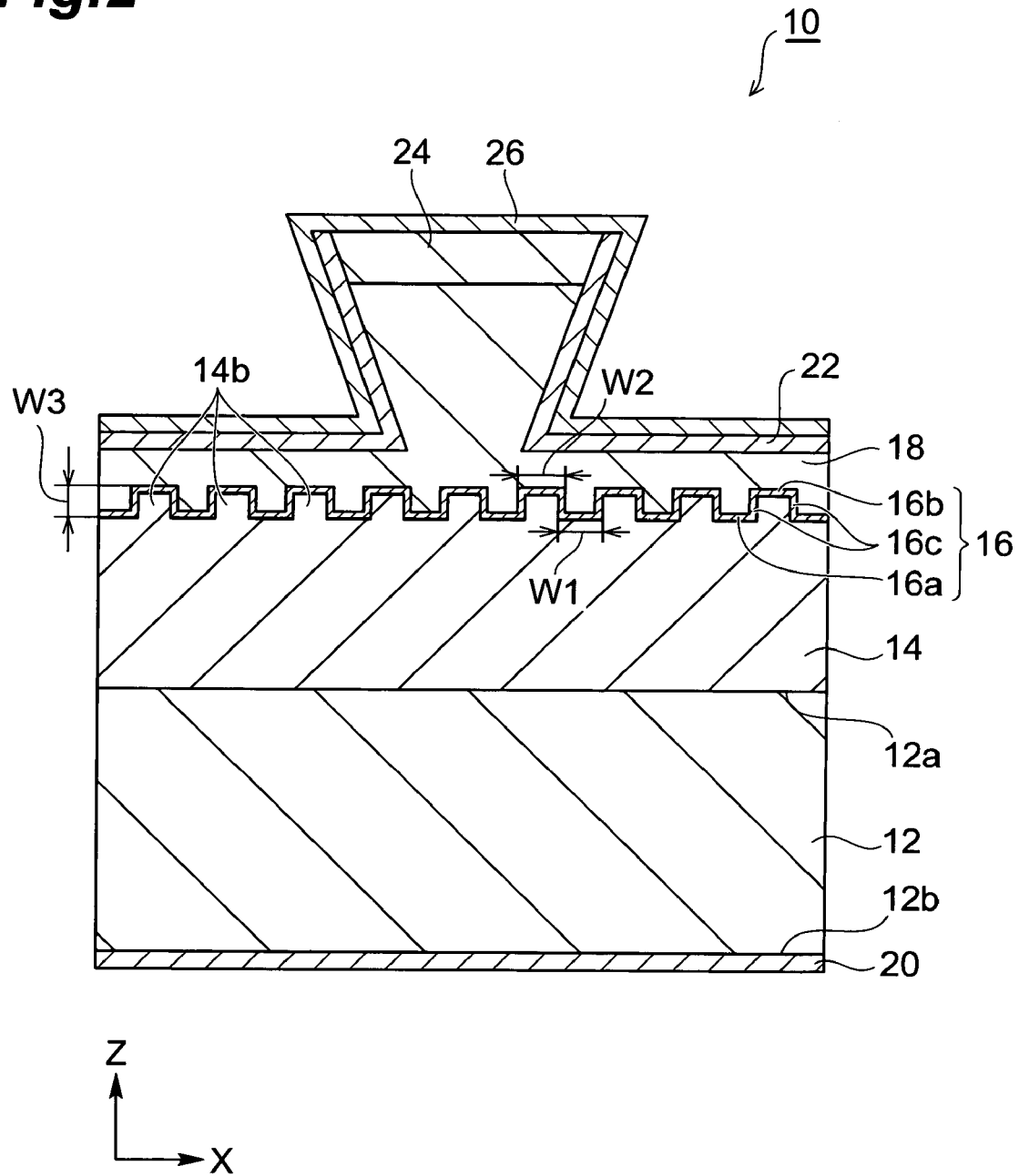
FIG. 2 is a cross sectional view, taken along I-I line in FIG. 1, showing a semiconductor optical amplifier according to the first embodiment of the present invention.

FIG. 1 is a perspective view partly in section showing a semiconductor optical amplifier according to the first embodiment of the present invention. FIG. 2 is a cross sectional view, taken along I-I line in FIG. 1, showing the semiconductor optical amplifier according to the first embodiment of the present invention. Referring to FIGS. 1 and 2, a semiconductor optical amplifier 10 includes a semiconductor substrate 12, a lower cladding layer 14, an active layer 16 and an upper cladding layer 18. Light in the active layer 16 propagates in a propagation direction, for example, the Y direction in FIG. 1.

The semiconductor substrate 12 is made of a first conductive type semiconductor, such as GaAs, and has a primary surface 12a and a backside 12b which intersect with a predetermined axis, for example, the Z-axis shown in FIG. 1.

On the primary surface 12a of the semiconductor substrate 12, the lower cladding layer 14, the active layer 16 and the upper cladding layer 18 are provided, and the active layer 16 is provided between the lower cladding layer 14 and the upper cladding layer 18. On the other side 12b of the semiconductor substrate 12, a lower electrode 20 is provided. The lower electrode 20 is made of AuGeNi, for example. The semiconductor substrate 12 has the same conductive type as that of the lower cladding layer 14 and is heavily doped, by which an ohmic contact is formed at the interface between the substrate 12 and the lower electrode 20.

The lower cladding layer 14 is formed on the primary surface 12a of the semiconductor substrate 12, and is a cladding layer of a first conductive type, for example, the n-conductive type. The lower cladding layer 14 has a base region 14a and a plurality of ridge regions 14b. The base region 14a extends along a reference plane intersecting with the predetermined axis, for example the Z-axis, and has a plurality of first portions 14c and a plurality of second portions 14d. The first portions 14c and second portions 14d are alternately arranged along a reference plane intersecting with the predetermined axis and are arranged in a direction, for example, the X direction, which is perpendicular to the propagation direction (the Y direction in FIG. 1) and the predetermined axis (Z-axis in FIG. 1). The first portions 14c and second portions 14d both extend in the propagation direction (the Y direction in FIG. 1).

The ridge regions 14b are located on the second portions 14d, respectively. Each of the ridge regions 14b has a top face 14e and a pair of side faces 14f. The top face 14e is provided along a reference plane intersecting with the predetermined axis. The interval between the primary surface 12a and the top of the first region 14c is smaller than the interval between the primary surface 12a and the top face 14e. Each of the pair of side faces 14f extends from the edge of the top of each first portion 14c toward the edge of the top face 14e.

The lower cladding layer 14 is formed by the following; growing a semiconductor layer having a surface corresponding to the top face 14e; forming patterns of a mask on regions of the above surface corresponding to the top face 14e; etching it to a depth to form the ridges 14b.

The lower cladding layer 14 can be made of GaInP, GaInAsP, AlGaInP or AlGaAs. The lower cladding layer 14 is doped with the first conductive type dopant, such as silicon. Preferably, the lower cladding layer 14 is made of material that does not contain aluminum, such as GaInP or GaInAsP. Because these materials have no aluminum which is easily oxidized, the generation of the nonradiative recombination centers due to oxidation can be well suppressed in the lower cladding layer 14, which makes it possible to grow an active layer 16 on the lower cladding layer 14 with an excellent crystalline quality. As a result, defects increase and degradation of crystalline quality due to the oxidation can be removed, which leads to a good device characteristics, a high yield and a high reliability.

On the lower cladding layer 14, an active layer 16 and an upper cladding layer 18 are successively grown. The upper cladding layer 18 has a second conductive type, for example p-type in this embodiment. The upper cladding layer 18 can be made of GaInP, GaInAsP, AlGaInP or AlGaAs. The upper cladding layer 18 is doped with a second conductive type dopant, such as zinc (Zn) and carbon (C).

The semiconductor optical amplifier 10 includes a ridge stripe structure to confine current. That is, The upper cladding layer 18 has a ridge that extends in the above propagating direction. A SiN film 22 is provided on the side faces 15a, 15b and faces 15c, 15d of the ridge stripe structure. A contact layer 24 of the second conductive type (p-type) is provided on the top face 15e of the ridge stripe structure. The upper electrode 26 is provided on the contact layer 24 and the SiN film 22.

The upper electrode 26 is made, for example, of TiPtAu. The contact layer 24 is made, for example, of GaAs. The contact layer 24 is heavily doped with dopant of the same conductive type as that of the upper cladding layer 18, by which the contact layer 24 and the upper electrode 26 can form a ohmic contact between them.

The semiconductor optical amplifier 10 has one facet 10a and the other facet 10b. An anti-reflection coating 28a is provided on the facet 10a and an anti-reflection coating 28b is provided on the other facet 10b. These anti-reflection coatings 28a and 28b can lower the reflection on both facets of the semiconductor optical amplifier 10 and suppress the lasing oscillation. As a result, the optical device 10 can operate as semiconductor optical amplifier. For example, an SiN film can be used for the anti-reflection films 28a and 28b.

The active layer 16 is provided between the lower cladding layer 14 and the upper cladding layer 18 The active layer 16 has a bulk structure, and can be made of material that is lattice-matched with that of the substrate, i.e., strain-free material. The active layer 16 can be made for example, of GaInNAs.

The active layer 16 has first portion 16a, second portion 16b and third portion 16c which are formed on the lower cladding layer 14. The first portion 16a is provided on the first portion 14c of the base region 14a of the lower cladding layer 14. The second portion 16b is provided on the top face 14e of each ridge region 14b. The third portion 16c is provided on the side face 14f of the base region 14a of the ridge portion 14b. In other words, the top face of the active layer 16 forms a number of ridges and a number of grooves that extend in the Y direction, and the active layer 16 includes third portion 16c which has a high TM mode gain and first and second portions 16a and 16b which have a high TE mode gain. These three portions are arranged alternately. The lengths of the first to third portions 16a to 16c are determined such that the TE mode gain is substantially equal to the TM mode gain. In one example, the length of the first portion, taken along the X direction, is in the range of 0.1 to 0.5 micrometers; the length of the second portion, taken along the X direction, is in the range of 0.1 to 0.5 micrometers; the length of the third portion, taken along the Z direction, is in the range of 0.1 to 0.5 micrometers. These length values are appropriately determined in accordance with the underlying ridge structure such that the TE mode gain and the TM mode gain are substantially equal to each other. For example, in the case of the square ridge structure 14b as shown in FIG. 2, the TE mode gain and the TM mode gain are substantially equal to each other, if the total of the summation of lengths of the first portions 16a and the summation of lengths of the second portions 16b is substantially equal to the summation of lengths of the third portions 16c.

Then the amplification characteristics of the semiconductor optical amplifier 10 is little dependent on the polarization direction because the first to third portions 16a to 16c are provided so that the TE mode gain and the TM mode gain are substantially equal to each other.

In the semiconductor optical amplifier 10, the active layer 16 is grown on the first portion 14c and the ridge 14b. The active layer 16 is grown by Organo-Metallic Vapor Phase Epitaxy (OMVPE) or Molecular Beam Epitaxy (MBE) method, and thus the active layer 16 can be formed without etching. In this case, the growth rates of the first portions 16a grown on the first portions 14c, the second portions 16b grown on the top faces 14e and the third portions 16c grown on the side faces 14f are different from each other, which leads to the thickness differences of the active layer 16 among the three portions. However, the active layer 16 has a bulk structure, so that its gain characteristic has a small dependence on its thickness. Thus, the gain is less sensitive to its thickness variation. On this point of view, the thickness variation of the active layer need not be taken into account, and only the following should be considered: the proportions of the lengths W1, W2 and W3 of the first to third portions on the cross section taken perpendicular to the optical light propagating direction in FIG. 2, thereby facilitating the fabrication. Specifically, in the case of a square ridge 14b as shown in FIG. 2, if the total of the summation of length W1 of the first portions 16a and the summation of length W2 of the second portions 16b is equal to the summation of length W3 of the third portions 16c, the dependence of the gain of the semiconductor optical amplifier 10 on the polarization direction can be reduced effectively.

Second Embodiment

Figure 3:
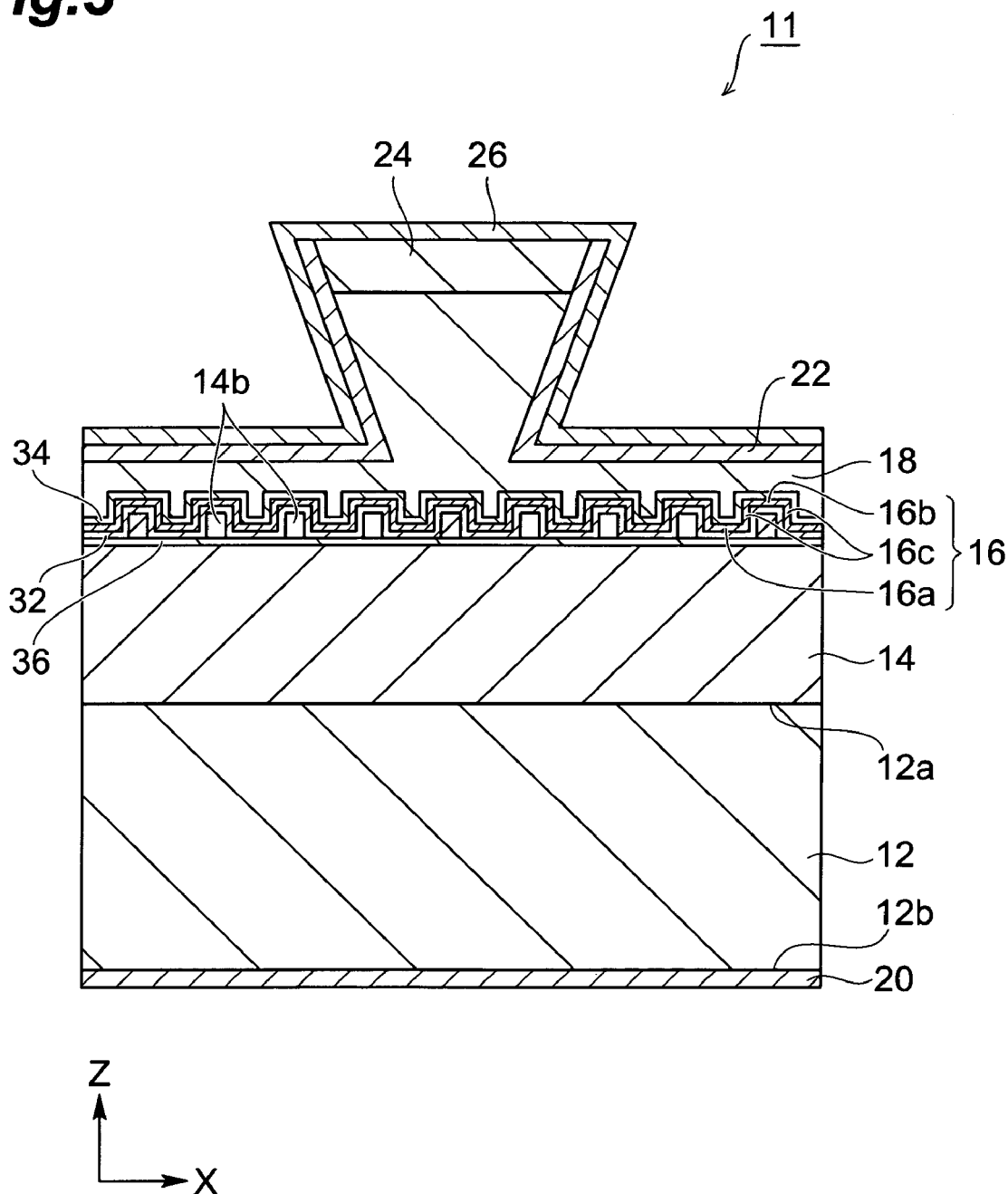
FIG. 3 is a cross sectional view, taken along a line equivalent to the first embodiment, showing a semiconductor optical amplifier according to the second embodiment of the present invention.

A semiconductor optical amplifier according to the second embodiment will be described below. FIG. 3 is a cross-sectional view showing the semiconductor optical amplifier.

The structure of the semiconductor optical amplifier 11 is the same as the above semiconductor optical amplifier 10 except for the following.

First, the semiconductor optical amplifier 11 has a first optical confinement layer 32 provided between the lower cladding layer 14 and the active layer 16, and a second optical confinement layer 34 provided between the upper cladding layer 18 and the active layer 16.

The first optical confinement layer 32 has a bandgap energy between that of the lower cladding layer 14 and that of the active layer 16, and has a refractive index between that of the lower cladding layer 14 and that of the active layer 16.

The second optical confinement layer 34 has a bandgap energy between that of the upper cladding layer 18 and that of the active layer 16, and has a refractive index between that of the upper cladding layer 18 and that of the active layer 16.

When the lower cladding layer 14 and upper cladding layer 18 are made of GaInP or GaInAsP, the first optical confinement layer 32 and the second optical confinement layer 34 can be made of AlGaAs, GaAs or GaInAsP. When the lower cladding layer 14 and upper cladding layer 18 are made of AlGaInP or AlGaAs, the first optical confinement layer 32 and the second optical confinement layer 34 can be made of AlGaAs, GaAs, GaInAsP, AlGaInP or GaInP. Preferably, the first optical confinement layer 32 and the second optical guiding layer 34 can be made of aluminum-free material as described above.

By use of the first and second optical confinement layers 32 and 34, the band gap energy can be decreased by gradual step in the directions from the cladding layers toward the active layer. Therefore, carriers from the cladding layers 14 and 18 are effectively injected into the active layer 16 without being blocked by the first and second optical confinement layers 32 and 34. The injected carriers are confined into the active layer 16 by the following: the built-in potential between the first optical confinement layers 32 and the active layer 16; the built-in potential between the second optical confinement layers 34 and the active layer 16.

By use of the first and second optical confinement layers 32 and 34, light generated by the active layer 16 is more strongly confined into the active layer 16 than semiconductor optical amplifiers that do not have any optical confinement layers, thereby providing better oscillation characteristics, such as the decrease of the threshold current and the improvement of temperature characteristics.

The semiconductor optical amplifier 11 includes an etching stop layer 36 against the etching of the lower cladding layer 14, and the etching stop layer 36 is provided between the base region 14a of the lower cladding layer 14 and the ridge 14b thereof. The etching stop layer 36 can be made of material having a lower etching rate than that of the lower cladding layer 14.

When the lower cladding layer 14 is made of AlGaInP or GaInP, the etch stop layer can be made of AlGaAs, GaAs or GaInAsP that has the same conductive type as that of the lower cladding layer 14. In this case, for example, if hydrochloric acid based etchant is used, the etching rate of the etch stop layer 36 layer is much lower than that of the lower cladding layer 14.

When the lower cladding layer 14 is made of AlGaAs or GaInAsP, the etch stop layer can be made of AlGaInP or GaInP that has the same conductive type as that of the lower cladding layer 14. In this case, for example, if phosphoric acid based etchant is used, the etching rate of the etch stop layer 36 layer is much lower than that of the lower cladding layer 14.

The etch stop layer 36 can stop etching of the lower cladding layer 14 and thus the lower cladding layer 14 below the etch stop layer 36 is not etched. Consequently, variation in the height of the ridge 14b of the lower cladding layer 14 can be suppressed even if the etching rate is varied in each area of the wafer and in each fabrication. Accordingly, variations in characteristics of the semiconductor optical amplifier 11 due to the above variations can be made small.

Preferably, the etch stop layer 36 can be made of material that does not contain aluminum as a constituent.

Having described and illustrated preferred embodiments according to the present invention, the present invention is not limited thereto. It is appreciated by those having skill in the art that the invention can be modified in arrangement and detail without departing from such principles.

For example, although the strain-free active layer 16 is used in the preferred embodiments according to the present invention, the active layer 16 with compressive or tensile strain can be used. Because of the large thickness of the active layer 16 having a bulk structure, a large strain cannot be applied to the active layer 16. However, if the strain is small, it generates no defects such as misfit dislocations, so that the active layer 16 can maintain a good crystalline quality. In this case, since lattice-matched conditions are not required to the active layer 16, a variety of materials can be used for the active layers of semiconductor optical amplifiers and therefore, the wavelength range of the input light which the semiconductor optical amplifier can amplify can be widened. Therefore, the design flexibility is increased as compared to the semiconductor optical amplifier without strain and the structural optimization can be done more easily. When material of the active layer 16 has a larger lattice constant than that of the substrate 12, compressive strain is applied to this active layer 16. When material of the active layer 16 has a smaller lattice constant than that of the substrate 12, tensile strain is applied to this active layer 16. When the substrate 12 is made of GaAs, the active layer 16 of a strained bulk structure can be made of InGaAs, GaNAs, GaInNAs and so on.

The above embodiments uses the ridge stripe structure in which current is confined to the center region of the active layer by use of an insulating film, but other current confinement structures can be used without any limitation. For example, the following structures can be used: the buried in which the upper cladding layer gas the same ridge structure as that of the above ridge stripe structure, but the current confined by use of semiconductor layers in place of the above insulating film; the buried hetero-structure in which current is confined by use of the current blocking layers that bury both sides of the mesa-shaped active region for the current confinement of the active region. The former buried ridge stripe structure is superior to the above ridge stripe structure in the radiation of heat and the reduction of stress-induced degradation because the ridge structure is buried by semiconductor with smaller stress applied thereto and a higher thermal conductivity than insulators. The latter buried hetero-structure greatly improves oscillation characteristics, such as the reduction of threshold current and the increase of slope efficiency, because the stimulated emission is more effectively caused than the ridge stripe structure by the strong confinement of both current and light into the active layer of a few micrometers in width.

Although a GaAs substrate is used as a base for crystal growth in the embodiments, and a hetero-substrate, in which a GaAs semiconductor layer is grown on a different kind of substrate, such as a silicon substrate, can be used as the base. Such hetero-substrates increase design flexibility and permit the integration of optical devices and electron devices which are made on different substrates.

The present invention is applicable to any kind of semiconductor optical amplifier in which other substrates, such as InP substrate and GaN substrate, is used to form semiconductor optical amplifiers. Long wavelength semiconductor optical amplifiers in the wavelength region from 1.3 to 1.6 micrometers can be made using InP substrates and related materials, and blue semiconductor optical amplifier in the wavelength region from 0.3 to 0.6 micrometers can be made using GaN substrates and related materials.

Having described and illustrated the embodiments of the semiconductor optical amplifiers according to the invention, the application of the present invention is not limited thereto. The invention is applicable to the following: light emitting diodes, semiconductor lasers, electro-absorption semiconductor modulators, Mach-Zehnder type optical modulators, optical wave-guides and the integration device of these. The application of the present invention provides semiconductor optical devices that can improve the yield, reproducibility, uniformity, and reliability and reduce polarization dependence. Details of structures of these devices can be modified as necessary. We therefore claim all modifications and variations coming within the spirit and scope of the following claims.

What is claimed is:

1. A semiconductor optical device comprising:
    a semiconductor substrate having a primary surface, the primary surface intersecting with a predetermined axis;
    a lower cladding region of the first conductive type provided on the primary surface of the semiconductor substrate, the lower cladding region including a plurality of ridge regions and a base region, the base region having a plurality of first portions and a plurality of second portions, the first portions and the second portions being alternately arranged along a predetermined plane perpendicular to the predetermined axis, each first portion extending in an optical propagating direction, each second portion extending in the optical propagating direction, each ridge region being located on each second portion, each ridge region having a side and a top, and each first portion having a top;
    an upper cladding layer of the second conductive type provided on the primary surface of the semiconductor substrate; and
    a bulk active layer provided between the upper cladding layer and the lower cladding region, the bulk active layer including a plurality of first portions, a plurality of second portions and a plurality of third portions, each first portion of the bulk active layer being located on each first portion of the base region of the lower cladding region, each second portion of the bulk active layer being located on the top of each ridge region and each third portion of the bulk active layer being located on the side of each ridge region.

2. The semiconductor optical device according to claim 1, wherein the active layer has compressive strain.

3. The semiconductor optical device according to claim 1, wherein the active layer has tensile strain.

4. The semiconductor optical device according to claim 1, further including:
    a first optical confinement layer provided between the active layer and the lower cladding region, the first optical confinement layer having a bandgap energy between that of the active layer and that of the lower cladding region and the first optical confinement layer having a refractive index between that of the active layer and that of the lower cladding region; and a second optical confinement layer provided between the active layer and the upper cladding layer, the second optical confinement layer having a bandgap energy between that of the active layer and that of the upper cladding layer and the second optical confinement layer having a refractive index between that of the active layer and that of the upper cladding layer.

5. The semiconductor optical device according to claim 1, wherein the plurality of ridge regions and the base region are integrally formed to provide the lower cladding region.

6. The semiconductor optical device according to claim 1, further comprising an etch stop layer, the etch stop layer being made of material of a etching rate lower than that of the lower cladding region, the etch stop layer being provided between the ridge region and the base region of the lower cladding region, and a distance between the top of the ridge region and the primary surface of the substrate being larger than a distance between the top of the first portion of the base region of the lower cladding region and the primary surface of the substrate.

7. The semiconductor optical device according to claim 1, wherein the semiconductor optical device includes a semiconductor laser.

8. The semiconductor optical device according to claim 1, wherein the semiconductor optical device includes a light emitting diode.

9. The semiconductor optical device according to claim 1, wherein the semiconductor optical device includes a semiconductor optical amplifier.

10. The semiconductor optical device according to claim 1, wherein the semiconductor optical device includes an electro-absorption type modulator.

11. The semiconductor optical device according to claim 1, the semiconductor optical device includes a semiconductor optical waveguide.

12. The semiconductor optical device according to claim 1, the semiconductor optical device includes a Mach-Zehnder type optical modulator.

* * * * *